(12) United States Patent
Dekker et al.

(10) Patent No.: US 7,314,782 B2
(45) Date of Patent: Jan. 1, 2008

(54) METHOD OF MANUFACTURING A SEMICONDUCTOR DEVICE AND A SEMICONDUCTOR DEVICE OBTAINED BY MEANS OF SAID METHOD

(75) Inventors: Ronald Dekker, Eindhoven (NL); Jan Baptist Petrus Henricus Van Der Putten, Eindhoven (NL); Ramon Jacob Havens, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 457 days.

(21) Appl. No.: 10/527,777

(22) PCT Filed: Aug. 21, 2003

(86) PCT No.: PCT/IB03/03934

§ 371 (c)(1), (2), (4) Date: Mar. 14, 2005

(87) PCT Pub. No.: WO2004/027860

PCT Pub. Date: Apr. 1, 2004

(65) Prior Publication Data

US 2006/0046439 A1 Mar. 2, 2006

(30) Foreign Application Priority Data

Sep. 17, 2002 (EP) .................................. 02078873

(51) Int. Cl.
*H01L 21/00* (2006.01)

(52) U.S. Cl. ...................... 438/114; 257/620; 438/458; 438/460

(58) Field of Classification Search ................ 257/620, 257/E21.596, E21.599; 438/68, 113, 114, 438/458, 460–465
See application file for complete search history.

(56) References Cited

U.S. PATENT DOCUMENTS

| 5,879,964 | A | * | 3/1999 | Paik et al. | 438/113 |
| 5,950,070 | A | * | 9/1999 | Razon et al. | 438/113 |
| 5,953,588 | A | * | 9/1999 | Camien et al. | 438/106 |
| 6,326,240 | B1 | * | 12/2001 | Liaw | 438/113 |
| 6,444,499 | B1 | * | 9/2002 | Swiss et al. | 438/127 |
| 6,455,353 | B2 | * | 9/2002 | Lin | 438/113 |
| 2002/0168798 | A1 | * | 11/2002 | Glenn et al. | 438/110 |
| 2005/0227415 | A1 | * | 10/2005 | Farnworth et al. | 438/114 |

* cited by examiner

*Primary Examiner*—Mary Wilczewski
*Assistant Examiner*—Seth Barnes
(74) *Attorney, Agent, or Firm*—Paul Im

(57) ABSTRACT

The invention relates to a method of manufacturing a semiconductor device (10) in which, in a semiconductor body (1) with a temporary substrate (2), at least one semiconductor element (3) is formed which, on a side of the semiconductor body (1) opposite to the substrate (2), is provided with at least one connection region (4), and, on the said side, a dielectric (5) is formed and patterned to leave free the connection region (4), after which a metal layer (6) is deposited over the dielectric (5) so as to be in contact with the connection region (4), which metal layer (6) serves as an electric connection conductor of the connection region (4), after which the temporary substrate (2) is removed and the metal layer (6) also serves as a substrate of the device (10). According to the invention, before the metal layer (6) is deposited, there is formed, around the patterned part of the dielectric (5) and around the semiconductor element (3), an annular region (7) of a resin having a larger thickness than the dielectric (5), and the metal layer (6) is deposited within the rectangular annular region (7). In this way, an individual device (10) can readily be formed after the metal layer (6) has been deposited, preferably by pushing the device (10) out of the region (7). Preferably, a (different) photoresist is chosen for the dielectric (5) and the region (7). The invention also comprises a semiconductor device (10) obtained in this way.

14 Claims, 5 Drawing Sheets

Figure 1:
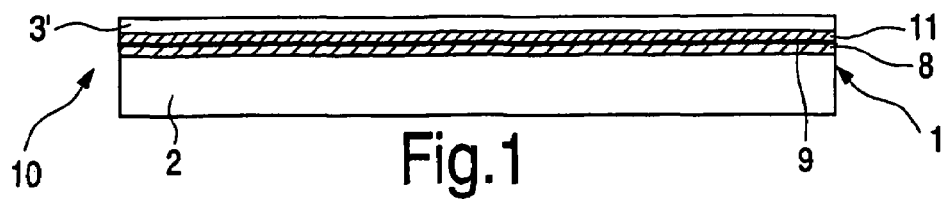
Figure 2:
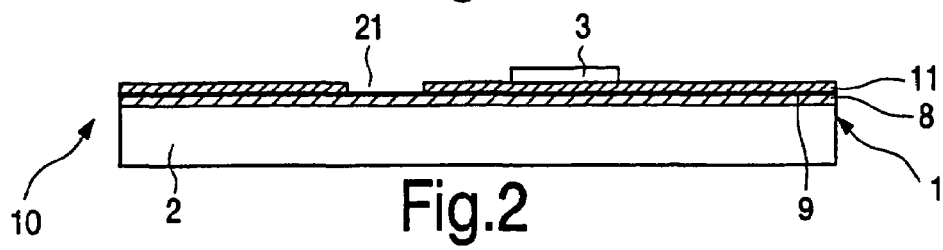
Figure 3:
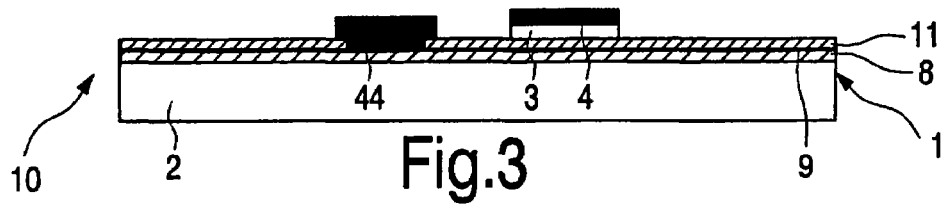
Figure 4:
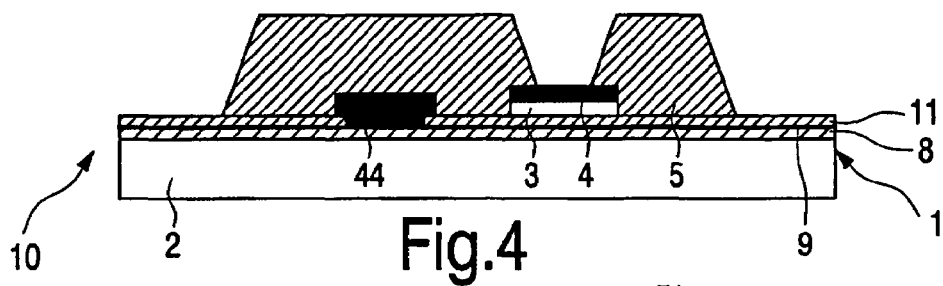
Figure 5:
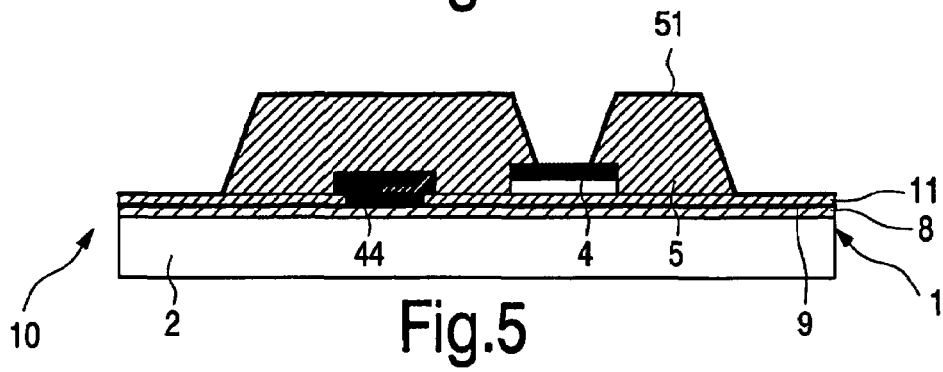
Figure 6:
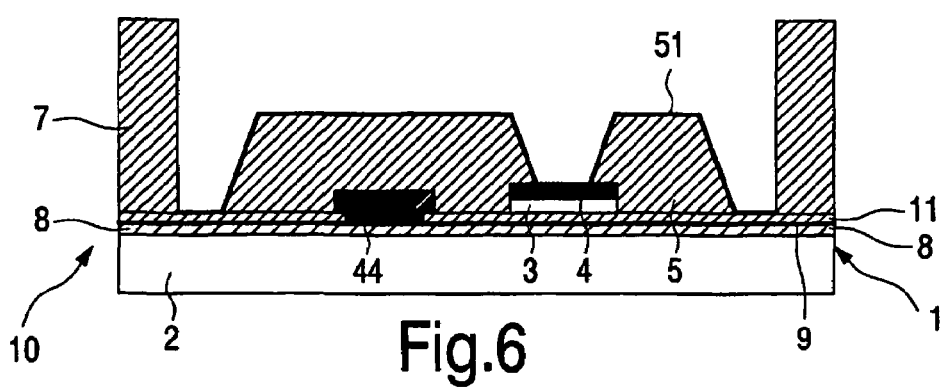
Figure 7:
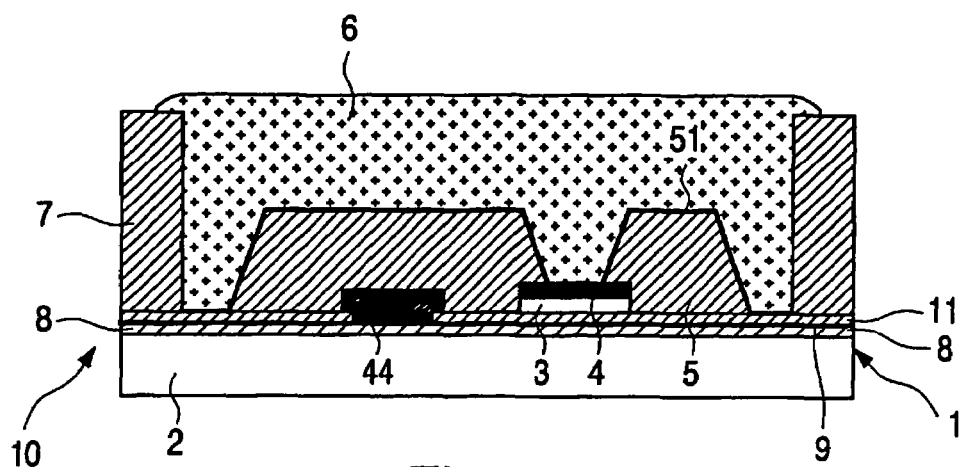
Figure 8:
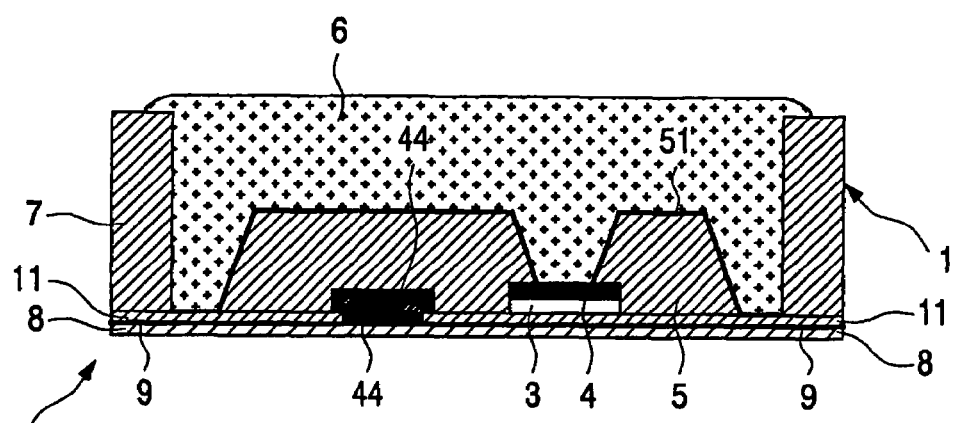
Figure 9:
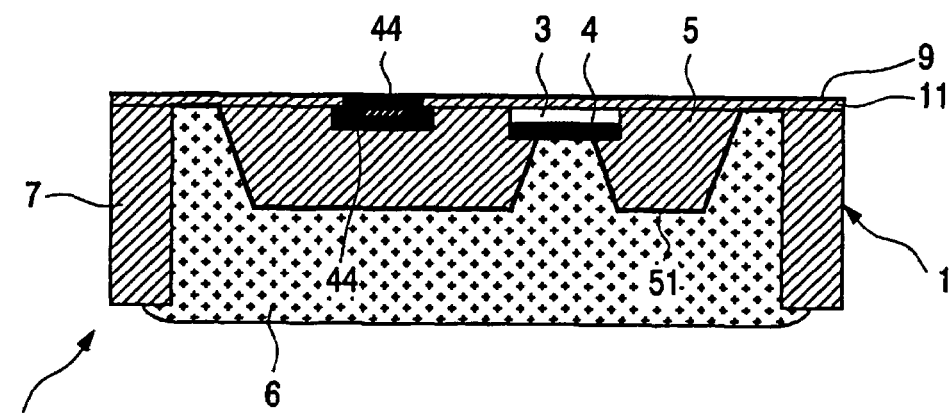

METHOD OF MANUFACTURING A SEMICONDUCTOR DEVICE AND A SEMICONDUCTOR DEVICE OBTAINED BY MEANS OF SAID METHOD

The invention relates to a method of manufacturing a semiconductor device, in which, in a semiconductor body having a temporary substrate, at least one semiconductor element is formed which, on a side of the semiconductor body opposite the substrate, is provided with at least one connection region, and, on the side of the semiconductor body where the connection region is formed, a dielectric is provided in accordance with a pattern leaving the connection region exposed, after which a metal layer is provided over the dielectric so as to be in contact with the connection region, which metal layer serves as an electric connection conductor of the connection region, after which the temporary substrate is removed and the metal layer serves as a substrate. Said metal layer also serves as a thermal conductor to dissipate heat. Such a method enables an integrated or unintegrated semiconductor device to be manufactured which can be used at very high frequencies, such as a frequency equal to or exceeding 50 GHz.

A method of the type mentioned in the opening paragraph is known from a publication by M. Rodwell et al., entitled "Transferred-Substrate Heterojunction Bipolar Transistor Integrated Circuit Technology", published on pp. 169-174 of the Proceedings of the 11$^{th}$ International Conference on Indium Phosphide and Related Materials, which was held from 16 to 20 May 1999 in Davos, Switzerland. Said publication describes how an InP transistor on an InP substrate serving as a temporary substrate is provided with a patterned dielectric comprising a BCB (=Benzo Cyclo Butene), after which a copper layer is provided both within and on the patterned dielectric, which copper layer serves, within the patterned dielectric, as a thermal and electric via to the transistor. Subsequently, the InP substrate is removed and the copper layer also serves as a substrate for the transistor.

The known method has the drawback that if it is used to manufacture a large number of semiconductor devices, said semiconductor devices cannot be readily separated from each other. If the devices are separated by means of sawing, serious problems are encountered as sawing through metal layers causes the metal to be sawn to spread over the saw, as a result of which the sawing process is hampered. Removal of the metal layer prior to the sawing process by means of etching at the location of an area to be sawn through is impractical because the metal layer is very thick.

Therefore, it is an object of the invention to provide a practical method of the type mentioned in the opening paragraph, enabling a large number of semiconductor devices to be manufactured simultaneously and to be readily separated from each other.

To achieve this, a method of the type mentioned in the opening paragraph is characterized in accordance with the invention in that prior to the provision of the metal layer, a ring-shaped area of a synthetic resin is provided, viewed in projection, around the patterned part of the dielectric and around the semiconductor element, which ring-shaped area is provided in a thickness exceeding the thickness of the dielectric and the metal layer within the ring-shaped area of synthetic resin. The invention is primarily based on the recognition that by precluding that the metal layer is also formed on the regions of the semiconductor body where the devices must be separated from each other, the problem in question is resolved in a practical manner. After the provision of the metal layer within the ring-shaped area, the latter is removed again so that the area of the semiconductor body where the devices must be separated from each other is exposed again, thereby enabling a sawing process to be used without problems as the separation technique since sawing through a metal layer no longer has to take place. The solution in accordance with the invention further gives the advantage that a synthetic resin ring-shaped area can be provided very readily, in particular if use is made of a photoresist for this purpose. Said photoresist can be readily provided with the desired pattern and, after the application of the metal layer, it can be readily removed again by means of a suitable solvent. The ring-shaped area is not limited to a ring, but may also be a rectangle or a polygon.

In a particularly advantageous embodiment of a method in accordance with the invention, a photoresist is therefore selected as the material for the ring-shaped area, and said ring-shaped area is formed by means of photolithography. A particularly suitable photoresist is NANO SU-8, which is a negative photoresist that is commercially available from, inter alia, the firm of MicroChem under said name. Such a photoresist can be applied to the semiconductor body in a thickness between 10 and more than 200 μm in a single spin-coating process. This enables also the metal layer to be very thick, which is desirable in view of its functions of electric and thermal connection conductor and, in particular, the function of substrate, i.e. supporting part of the device. For the dielectric use is preferably also made of a photoresist. This can be attributed to the fact that a photoresist can be readily patterned by means of photolithography and also to the fact that it enables the dielectric to be relatively thick, for example in the range of 1 to 10 μm, and to the fact that a photoresist as the BCB, which exhibits very low RF (=radio frequency) losses, is very suitable in connection with the use of a so-termed strip-line technique. All of the above also has to do with the intended applications requiring both a high frequency and a high power dissipation.

Preferably, the thickness of the ring-shaped area is chosen to range between 10 and 200 μm. The thickness of the metal layer is preferably chosen to be between 5 and 20 μm thicker than the thickness of the ring-shaped area. After exposure, the photoresist can be developed using suitable solvents and removed again after it has been baked out. Such a developer and stripper which can suitably be used for the above-mentioned photoresist are supplied also by the firm of MicroChem. After stripping of the photoresist at the location of the ring-shaped area, sawing can take place at said location.

In a preferred embodiment of a method in accordance with the invention, individual semiconductor devices are obtained by pressing the semiconductor body out of the ring-shaped area. Surprisingly it has been found that the ring-shaped synthetic resin area does not necessarily have to be removed to separate a semiconductor device from neighboring devices. After the semiconductor body has been placed on a suitable foil, the metal layer can be pressed out of the ring-shaped area by exerting pressure on said foil by means of a punctiform object, causing the semiconductor body to be severed at the location of the ring-shaped area. This last is inter alia connected with the fact that a method in accordance with the invention employs the "substrate-transfer" technique, wherein the actual semiconductor body accommodating the semiconductor element is very thin, i.e. several micrometers at the most. After a semiconductor device has been pressed out of the ring-shaped area, said semiconductor device can be picked up, for example by means of a vacuum pincette, and readily further treated for final assembly or for being packaged.

In a further favorable modification, after the removal of the temporary substrate, a further rectangular ring-shaped area of a synthetic resin is provided, on said side of the semiconductor body, approximately opposite the ring-shaped area, and a further metal layer is applied within the further ring-shaped area.

In this manner, further connection regions of the semiconductor element can be provided with a connection conductor having excellent electrical and thermal connection characteristics as well as the desired, good high-frequency behavior.

Preferably, the semiconductor body is formed by providing a semiconductor substrate with a buried isolating layer above which the semiconductor element, the connection region and a further connection region of the semiconductor element are formed, said temporary substrate being formed by the part of the semiconductor substrate situated below the buried isolating layer. This method is simple and readily applicable to manufacture both MOS (=Metal Oxide Semiconductor) transistors and bipolar transistors.

In such a modification, preferably, between the buried isolating layer and the connection region, a further isolating layer forming an etch-stop layer with respect to the buried isolating layer and another isolating layer are provided wherein an aperture is formed wherein the further connection region is formed. Subsequently, after the removal of the temporary substrate, a part of the buried isolating layer situated below the further connection region is removed by means of an etchant that is selective with respect to the further isolating layer.

In a further modification of a method in accordance with the invention, a bipolar transistor is used as the semiconductor element, and the connection region is connected to the emitter region of the bipolar transistor. Preferably, a method in accordance with the invention is used, however, to form a MOS device, such as a (power) LD (=Laterally Diffused) MOS transistor.

The invention further comprises a semiconductor device obtained by means of a method in accordance with the invention.

These and other aspects of the invention are apparent from and will be elucidated with reference to the embodiment(s) described hereinafter.

Figure 10:
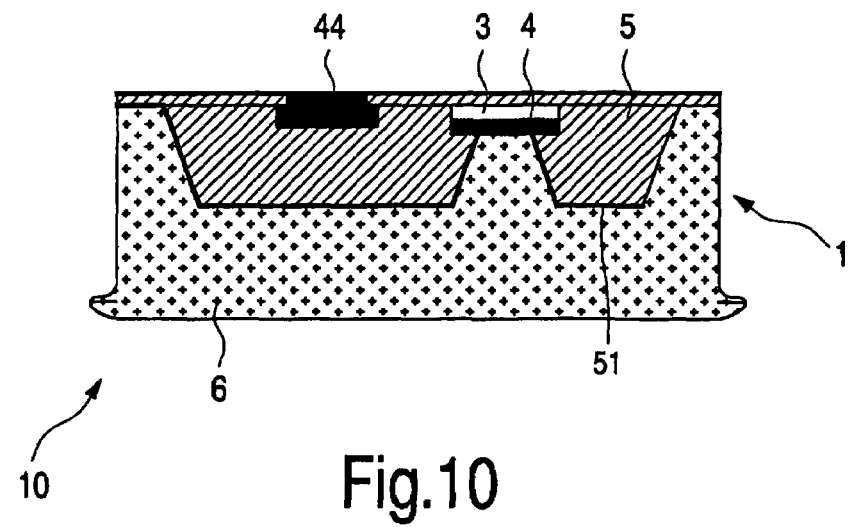
Figure 11:
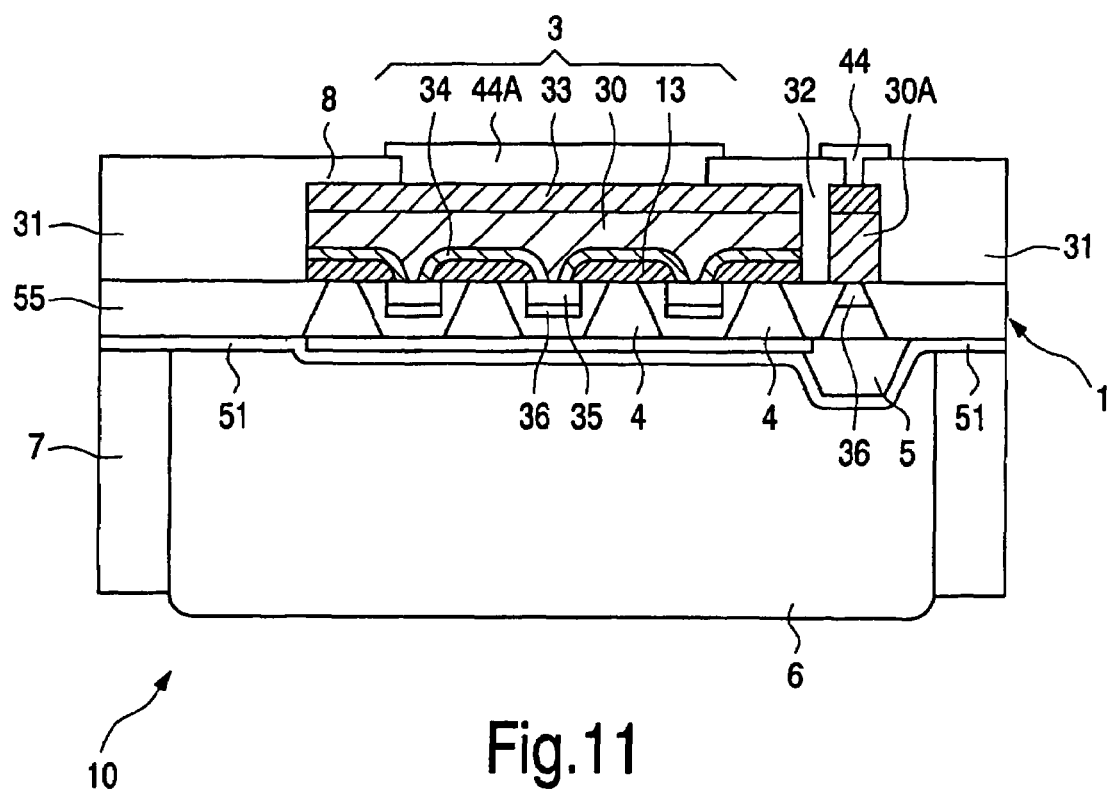
Figure 12:
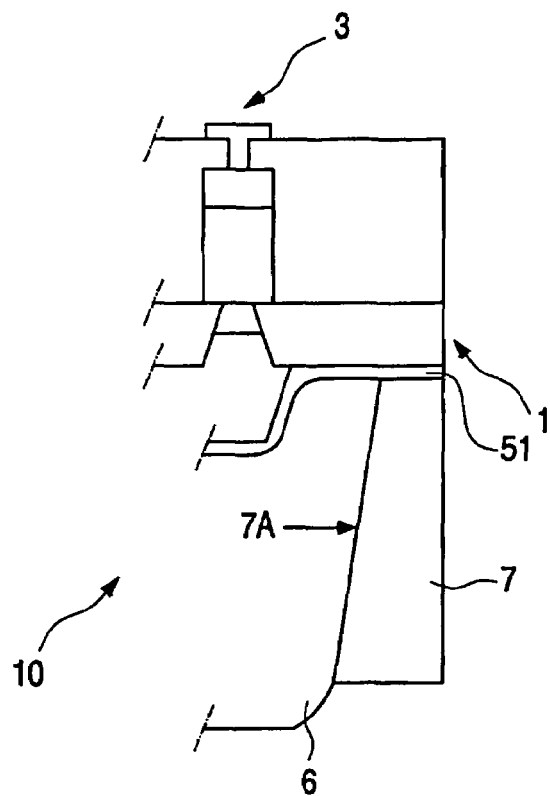
Figure 13:
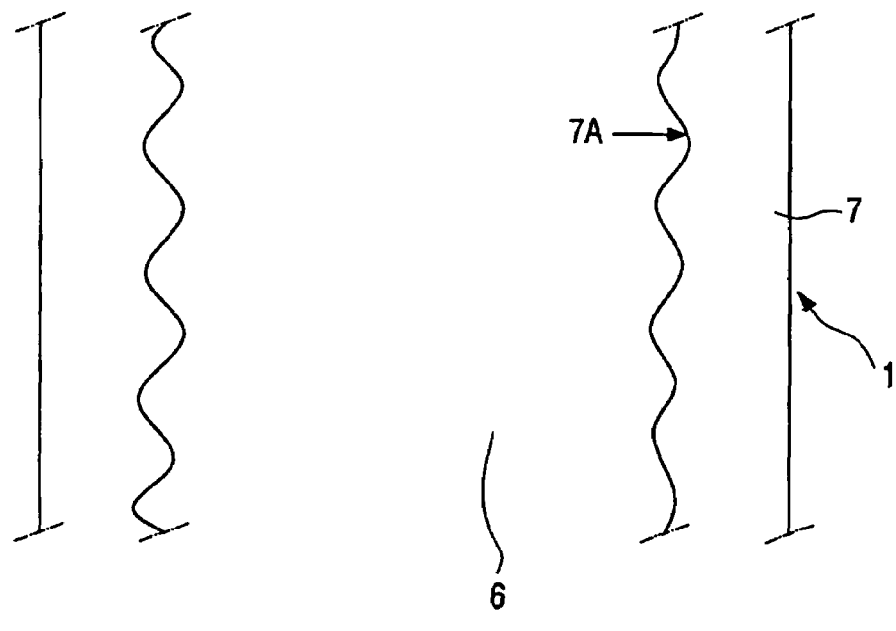
Figure 14:
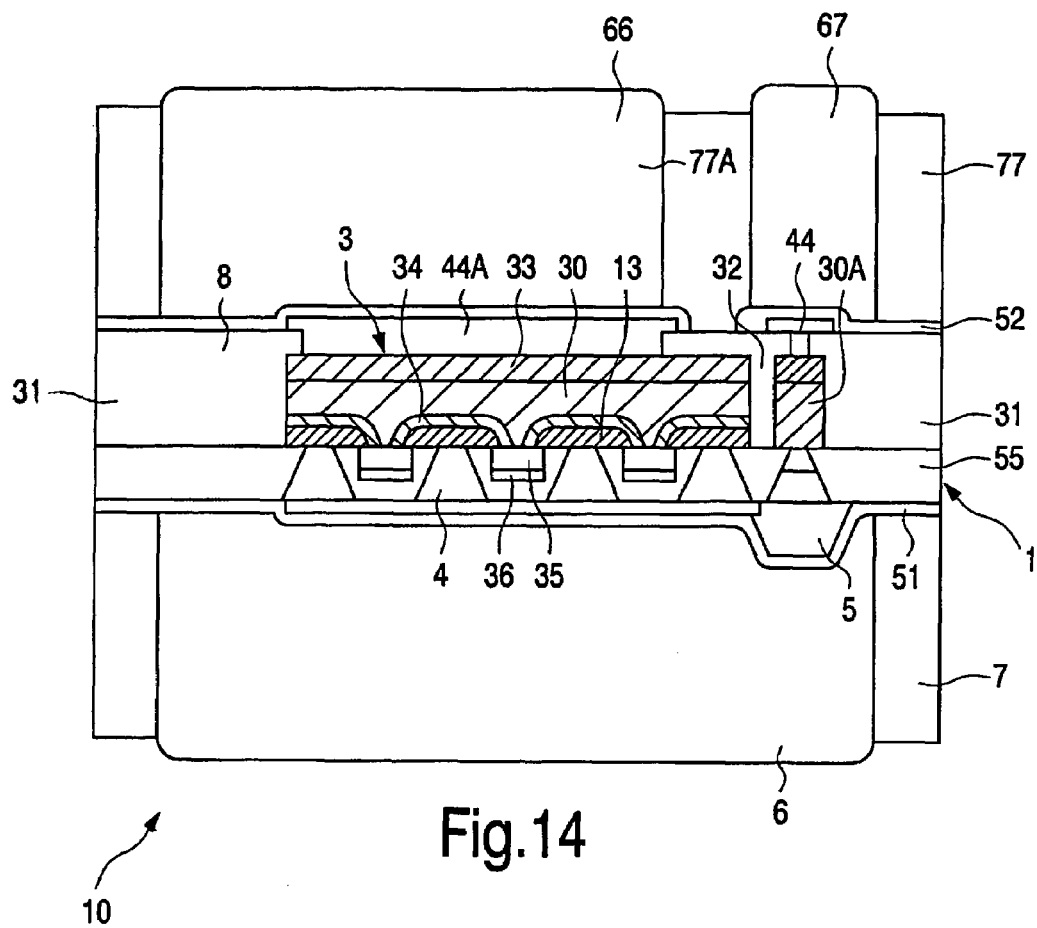
Figure 15:
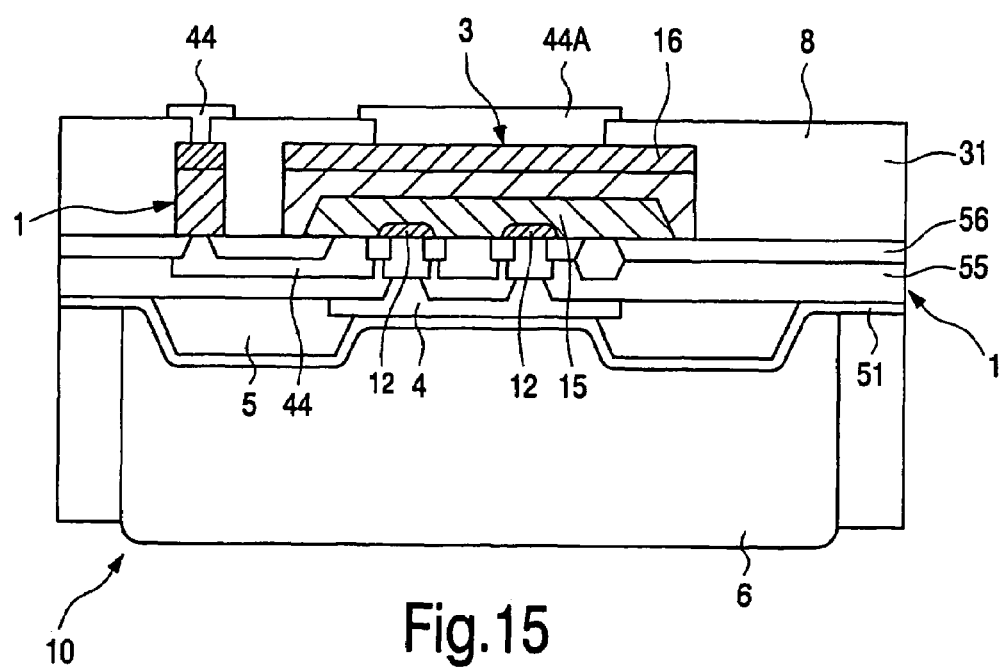

In the drawings:

FIGS. 1 through 10 are diagrammatic, cross-sectional views at right angles to the thickness direction of a semiconductor device in successive stages of the manufacture by means of a method in accordance with the invention, FIG. 11 is a diagrammatic, cross-sectional view at right angles to the thickness direction of a semiconductor device with an LDMOS transistor obtained by means of a method in accordance with the invention, FIG. 12 shows a detail of the sectional view of a modification of the semiconductor device shown in FIG. 11, FIG. 13 shows a detail of a plan view of a further modification of the semiconductor device shown in FIG. 11, FIG. 14 is a diagrammatic, cross-sectional view at right angles to the thickness direction of another modification of the semiconductor device shown in FIG. 11, and FIG. 15 is a diagrammatic, cross-sectional view at right angles to the thickness direction of a semiconductor device with a bipolar transistor obtained by means of a method in accordance with the invention.

The Figures are not drawn to scale and, for clarity, some dimensions, such as dimensions in the thickness direction, are exaggerated strongly. Corresponding areas or parts thereof are indicated in the different Figures by means of the same reference numerals whenever possible.

FIGS. 1 through 10 are diagrammatic, cross-sectional views at right angles to the thickness direction of a semiconductor device in successive stages of the manufacture by means of a method in accordance with the invention. The manufacture of the device 10 of this example is based here (see FIG. 1) on the use of an n-type silicon substrate 2 having customary dimensions and a customary doping concentration. Said substrate supports successively an electrically insulating silicon dioxide layer 8, a further insulating layer 9 of silicon nitride, another insulating layer 11 of silicon dioxide and a thin layer 3' of monocrystalline silicon. This structure can be produced, for example, by applying the insulating layers 8, 9, 11 onto a Si substrate 2 by means of CVD. On top of this a silicon substrate 3' is bonded, which is subsequently largely removed until a thickness of several micrometers is obtained. In the silicon layer 3', (see FIG. 3) a semiconductor element 3, such as a transistor, is formed after which the parts of the Si layer 3' situated outside the element 3 are removed. An aperture 21 is locally formed in further and other insulating layers 9, 11 so as to form a further connection region of the semiconductor element 3.

Subsequently (see FIG. 3) a metal layer, in this case of aluminum, is provided and patterned, resulting in the formation of a connection region 4, for example of the source of a transistor, and a further connection region 44, for example of the gate electrode of a transistor. Next (see FIG. 4) a photoresist 5 of BCB that serves as a dielectric is applied in a thickness of 5 µm, said photoresist being patterned such that the further connection region 44 is covered and the connection region 4 is left exposed. Said photoresist is provided, in this example, (see FIG. 5) with a thin nucleation layer 51, here of Cr/Cu, which extends throughout the surface of the device 10, said nucleation layer having a thickness, in this example, of 200 nm and comprising 50 nm Cr and 150 nm Cu.

Subsequently (see FIG. 6) a ring-shaped area 7 of synthetic resin is provided, in accordance with the invention, around the patterned BCB layer 5 and around the semiconductor element 3. The area 7 comprises, in this example, a photoresist, here NANO SU-8, having a thickness of 100 µm and a width of 200 µm, which is applied by means of spin coating followed by photolithography. Next (see FIG. 7) the nucleation layer 51 within the ring 7 is provided with a thick, here 110 µm, metal layer 6 containing copper by means of electrodeposition. Subsequently (see FIG. 8) the silicon substrate 2 below the insulating layer 8, which silicon substrate has served as a temporary substrate, is removed, in this case by means of etching using a concentrated KOH solution in water. In this process the ring 7 and the metal layer 6 are used as a mask, while the buried insulating layer 8 of silicon dioxide serves as an etch-stop layer.

Subsequently (see FIG. 9) the insulating layer 8 of silicon dioxide is removed by means of etching using a diluted solution of HF in water. While the connection region 4 is in contact with the copper layer 6 that serves as a thermal and electric connection conductor and now also as a substrate of the device 10, the semiconductor element's further connection region 44 situated on a side of the semiconductor body 1 opposite the copper layer 6 is exposed and hence available for connection of the device 10 on said side. The ring 7 can now be removed by means of a suitable solvent after which individual devices 10 are obtained by means of sawing at the location of the areas where the ring 7 was located.

In this example an individual device 10 is obtained, however, by placing the semiconductor body 1 on a membrane (not shown in the Figure) and exerting pressure on the metal layer 6 by means of a punctiform object (not shown in the Figure), thus causing an individual device 10 to be pressed out of the synthetic ring 7, which device can subsequently be picked up by means of a vacuum pincette. This is very attractive because of the simplicity and speed of the operation. As a result a sawing step can be dispensed with. The resultant device 10 is shown in FIG. 10 and is ready for final assembly, for example on a PCB (=Printed Circuit Board) or to be packaged for delivery to a customer.

FIG. 11 is a diagrammatic, cross-sectional view at right angles to the thickness direction of a semiconductor device with an LDMOS transistor obtained by means of a method in accordance with the invention. The stage of manufacture corresponds to that shown in FIG. 9, but in the sectional view of FIG. 11 the semiconductor element 3, here being an LDMOS transistor 3, is shown. The copper layer 6 here serves as a connection conductor of the connection region 4 of the source 13 of the transistor 3 that is embodied here so as to be finger-shaped, the finger-shaped parts of the source 13 being provided with a connection region 4 of aluminum. The transistor 3 is formed in a part 30 of the semiconductor body 1 that is situated above an insulating layer 8 of silicon dioxide. This part 30 is surrounded by a so-termed trench isolation 31 of silicon dioxide and comprises an area 30A which is isolated by means of a further trench insulation 32 and which is entirely highly doped. The n-type area 30 comprises a highly doped area 33 obtained by means of implantation which serves as a drain 33 of the transistor 3 and an oppositely doped area 34 which serves as a channel region 34 of the transistor 3. Above the channel region 34 there is a finger-shaped polycrystalline silicon gate electrode 35 on which a silicide layer 36 is present which is connected to the part 30A of the semiconductor body 1. The gate electrode 36 is isolated from the connection region 4 of the source 13 by means of a silicon dioxide layer 55 and is provided with a further connection region 44 on a side of the semiconductor body 1 opposite the copper layer 6. On the same side there is another connection region 44A for the drain 33 of the transistor 3.

In this example, the semiconductor body 1 shown in FIG. 1 is replaced by a semiconductor body 1 in which a buried insulating layer 8 of silicon dioxide is formed in a silicon substrate by means of implantation. In the overlying part of the substrate the transistor 3 is formed. Further, in connection therewith, the further connection region 44 and the other connection region 44A are not formed in the manner shown in FIGS. 1 through 3 but rather by applying, on said side of the semiconductor body 1, a photoresist in accordance with a pattern on the buried insulating layer 8 and by subsequently etching apertures in the insulating layer 8 and, after the removal of the photoresist, applying an aluminum layer 44 at the location of the apertures which is etched so as to obtain a suitable pattern.

FIG. 12 shows a detail of the sectional view of a modification of the semiconductor device shown in FIG. 11. Here, the synthetic resin ring 7 is provided with a profile on the side adjacent to the copper layer 6, which profile serves to improve the adhesion between the ring 7 and the copper layer 6. In this example, the profile is obtained by a tapering inner wall 7A of the ring 7 causing the copper layer to be confined as it were in the ring 7. If said ring 7 is formed by means of a positive photoresist and photolithography, then such a profile can be readily obtained by overexposure of the photoresist 7. A positive photoresist is to be taken to mean a resist the exposed parts of which are removed in the course of the developing process, whereas in the case of a negative resist said exposed portions remain intact.

FIG. 13 shows a detail of a plan view of a further modification of the semiconductor device shown in FIG. 11. Also in this Figure, an inner wall 7A of the ring 7 is provided with a profile that is formed, in this case, by a sinuous form of the inner wall 7A. Also if use is made of a photoresist 7 and photolithography to form the ring 7, this profile can be readily obtained by providing the mask used with a corrugated edge. This can be applied to both a positive and a negative photoresist 7.

FIG. 14 is a diagrammatic, cross-sectional view at right angles to the thickness direction of a different modification of the device shown in FIG. 11. In this modification, after the stage achieved in FIG. 11, a further synthetic resin ring 77 accommodating a smaller ring 77A is also formed on the other side of the semiconductor body 1 in a manner similar to ring 7. Within these rings, a further metal layer, in this case a copper layer 66, 67, is provided also in a manner similar to ring 7. The metal layer 66 extending inside the ring 77 serves as an electric and thermal connection for a further connection region 44A of the LDMOS transistor 3, in this case of the drain region 33 of the transistor 3. A part 67 of the metal layer situated inside the smaller ring 77A serves as a connection of the gate electrode 35, 36. Dependent upon the thicknesses chosen for the copper layers 6, 66/67, the copper layer 6 or the copper layer 66/67, or both, serve as a substrate of the device 10. The term substrate is to be taken to mean herein a supporting part of the device 10 as well as a part that, by virtue of its comparatively large thickness, provides the device 10 with the desired sturdiness/rigidity.

FIG. 15 is a diagrammatic, cross-sectional view at right angles to the thickness direction of a semiconductor device with a bipolar transistor 3 obtained by means of a method in accordance with the invention. Here too, the stage of the manufacture corresponds to that of the device shown in FIG. 11. The copper layer 6 here serves as a connection conductor of the connection region 4 of the emitter 12 of the bipolar transistor 3 having a base region 15 and a collector region 16. The transistor 3 in this example has an emitter 12 with a finger-shaped structure of which only two "fingers" are shown in FIG. 15 for the sake of simplicity. The highly doped part of the emitter 12 is formed by implantation. The base region 15 and the emitter region 12 are formed by means of diffusion. The surface is covered with an insulating layer 56 provided with apertures. The other parts of this transistor 3 correspond to those already considered when the transistor 3 of FIG. 11 was discussed. Also the formation of the further aluminum connection regions 44 and 44A of, respectively, the base region 15 and the collector region 16 of the transistor 3, takes place in the manner discussed in said example.

The invention is not limited to the example described herein because, within the scope of the invention, many variations and modifications are possible to those skilled in the art. For example, devices having a different geometry and/or different dimensions can be manufactured.

Instead of a semiconductor body of Si, a semiconductor body of Ge or III-V compounds such as GaAs or InP can be applied.

If a semiconductor body of Si is used, this does not necessarily have to comprise monocrystalline silicon. Polycrystalline silicon can also suitably be used for certain applications.

It is further noted that the device may comprise further active and passive semiconductor elements or electronic components, such as diodes and/or transistors and resistors and/or capacitors, whether or not in the form of an integrated circuit. The manufacturing process will of course be adequately adapted thereto.

The invention claimed is:

1. A method of manufacturing a semiconductor device, in which, in a semiconductor body having a temporary substrate, at least one semiconductor element is formed which, on a side of the semiconductor body opposite the substrate, is provided with at least one connection region, and, on the side of the semiconductor body where the connection region is formed, a dielectric is provided in accordance with a pattern leaving the connection region exposed, after which a metal layer is provided over the dielectric so as to be in contact with the connection region, which metal layer serves as an electric connection conductor of the connection region, after which the temporary substrate is removed and the metal layer serves as a substrate, characterized in that prior to the provision of the metal layer, a ring-shaped area of a synthetic resin is provided, viewed in projection, around the patterned part of the dielectric and around the semiconductor element, which ring-shaped area is provided in a thickness exceeding the thickness of the dielectric and the metal layer within the ring-shaped area of synthetic resin.

2. A method as claimed in claim 1, characterized in that a photoresist is selected as the material used for the synthetic resin of the ring-shaped area, and said ring-shaped area is formed by means of photolithography.

3. A method as claimed in claim 1, characterized in that a further photoresist is selected for the dielectric, which further photoresist is patterned by means of photolithography.

4. A method as claimed in claim 3, characterized in that the thickness of the dielectric is chosen to range from 1 to 10 µm, and the thickness of the ring-shaped area is chosen to range from 10 to 200 µm.

5. A method as claimed in claim 1, characterized in that copper is chosen as the metal for the metal layer, and the thickness of the metal layer is chosen to exceed the thickness of the ring-shaped area by 5 to 20 µm.

6. A method as claimed in claim 1, characterized in that after the provision of the metal layer, the ring-shaped area is removed and the semiconductor device is obtained by sawing through the parts of the semiconductor body where the ring-shaped area is situated.

7. A method as claimed in claim 1, characterized in that the semiconductor device is obtained by pressing the semiconductor body out of the ring-shaped area.

8. A method as claimed in claim 1, characterized in that a wall of the ring-shaped area adjoining the metal layer is provided with a profile.

9. A method as claimed in claim 1, characterized in that after the removal of the temporary substrate, a further rectangular ring-shaped area of a synthetic resin is provided, on said side of the semiconductor body, approximately opposite the ring-shaped area, and a further metal layer is applied within the further ring-shaped area.

10. A method as claimed in claim 1, characterized in that the semiconductor body is formed by providing a semiconductor substrate with a buried isolating layer above which the semiconductor element, the connection region and a further connection region of the semiconductor element are formed, the temporary substrate being formed by the part of the semiconductor substrate situated below the buried isolating layer.

11. A method as claimed in claim 9, characterized in that between the buried isolating layer and the connection region, a further isolating layer forming an etch-stop layer with respect to the buried isolating layer and another isolating layer are provided wherein an aperture is formed wherein the further connection region is formed, and after the removal of the temporary substrate, a part of the buried isolating layer situated below the further connection region is removed by means of an etchant which is selective with respect to the further isolating layer.

12. A method as claimed in claim 1, characterized in that the semiconductor element is formed by a bipolar transistor, and the connection region is connected to the emitter region of the bipolar transistor.

13. A method as claimed in claim 1, characterized in that the semiconductor element is formed by an LDMOS transistor, and the connection region is connected to the source region of the LDMOS transistor.

14. A semiconductor device obtained by means of a method as claimed in claim 1.

* * * * *